United States Patent
Kwon et al.

(10) Patent No.: US 8,937,315 B2
(45) Date of Patent: Jan. 20, 2015

(54) ORGANIC LIGHT EMITTING DIODE DISPLAY AND MANUFACTURING METHOD THEREOF

(75) Inventors: Oh-Seob Kwon, Yongin (KR); Deuk-Jong Kim, Yongin (KR); Moo-Soon Ko, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 305 days.

(21) Appl. No.: 12/929,994

(22) Filed: Mar. 1, 2011

(65) Prior Publication Data
US 2011/0215335 A1  Sep. 8, 2011

(30) Foreign Application Priority Data

Mar. 3, 2010  (KR) .......................... 10-2010-0019045

(51) Int. Cl.
*H01L 29/12*  (2006.01)
*H01L 33/18*  (2010.01)
*H01L 33/38*  (2010.01)

(52) U.S. Cl.
CPC ............... *H01L 33/18* (2013.01); *H01L 33/38* (2013.01)
USPC ............... 257/71; 257/532; 257/296; 257/72; 315/169.3; 345/211; 349/38

(58) Field of Classification Search
USPC ............... 257/72, 71; 349/43, 38; 315/169.3; 345/211
See application file for complete search history.

(56) References Cited

U.S. PATENT DOCUMENTS

| | | | |
|---|---|---|---|
| 6,351,078 B1* | 2/2002 | Wang et al. | 315/169.3 |
| 7,471,347 B2* | 12/2008 | Yoo et al. | 349/38 |
| 8,039,922 B2* | 10/2011 | Ni | 257/532 |
| 2002/0104995 A1* | 8/2002 | Yamazaki et al. | 257/72 |
| 2009/0027580 A1* | 1/2009 | Kurokawa et al. | 349/43 |
| 2011/0012880 A1* | 1/2011 | Tanaka et al. | 345/211 |

FOREIGN PATENT DOCUMENTS

| | | |
|---|---|---|
| JP | 10-041403 A | 2/1998 |
| JP | 2000-012541 A | 1/2000 |
| JP | 2002-158358 A | 5/2002 |
| JP | 2002-359252 A | 12/2002 |
| JP | 2003-258262 A | 9/2003 |
| JP | 2006-114871 A | 4/2006 |
| JP | 2008-216789 A | 9/2008 |
| KR | 10 2003-0010136 A | 2/2003 |
| KR | 10 2003-0013047 A | 2/2003 |
| KR | 10 2003-00716635 A | 9/2003 |
| KR | 10 2006-0058934 A | 6/2006 |

(Continued)

*Primary Examiner* — Eugene Lee
*Assistant Examiner* — Fang-Xing Jiang
(74) *Attorney, Agent, or Firm* — Lee & Morse, P.C.

(57) ABSTRACT

An organic light emitting diode display includes a substrate main body, a semiconductor layer and a first capacitor electrode on the substrate main body, bottom surfaces of the semiconductor layer and first capacitor electrode being substantially coplanar, and each of the semiconductor layer and first capacitor electrode including an impurity-doped polysilicon layer, a gate insulating layer on the semiconductor layer and the first capacitor electrode, a gate electrode on the semiconductor layer with the gate insulating layer therebetween, and a second capacitor electrode on the first capacitor electrode with the gate insulating layer therebetween, the second capacitor electrode including a convex electrode portion and a concave electrode portion, the concave electrode portion being thinner than each of the convex electrode portion and the gate electrode.

16 Claims, 14 Drawing Sheets

(56) References Cited

FOREIGN PATENT DOCUMENTS

| KR | 10 2006-0109638 A | 10/2006 |
| KR | 10 2008-0026826 A | 3/2008 |
| KR | 10 2008-0065334 A | 7/2008 |
| KR | 10 2008-0095735 A | 10/2008 |

* cited by examiner

ORGANIC LIGHT EMITTING DIODE DISPLAY AND MANUFACTURING METHOD THEREOF

BACKGROUND

1. Field

The described technology relates generally to an organic light emitting diode (OLED) display. More particularly, the described technology relates generally to an OLED display using an impurity-doped polysilicon film as an electrode of a capacitor and a manufacturing method thereof.

2. Description of the Related Art

An OLED display is a self emissive display device that displays images with OLEDs. Since the OLED display does not need a separate light source, unlike a liquid crystal display, it can have a relatively small thickness and weight. In addition, since the OLED display exhibits high-quality characteristics, e.g., low power consumption, high luminance, high response speed, etc., it is receiving much attention as a next-generation display device, e.g., for a portable electronic appliance.

The OLED displays are classified into passive matrix and active matrix types depending upon the way of driving them. For example, in the active matrix type OLED display, an OLED, a thin film transistor (TFT), and a capacitor are formed at the respective pixels so as to control the pixel in an independent manner.

The capacitor may be formed simultaneously with the TFT. For example, both electrodes of the capacitor may be formed simultaneously with a semiconductor layer and a gate electrode of the TFT, respectively. The semiconductor layer and one of the two electrodes of the capacitor may include an impurity-doped polycrystalline silicon layer.

The above information disclosed in this Background section is only for enhancement of understanding of the background of the described technology and therefore it may contain information that does not form the prior art that is already known in this country to a person of ordinary skill in the art.

SUMMARY

Embodiments are therefore directed to an OLED display using an impurity-doped polysilicon film as an electrode of a capacitor and a manufacturing method thereof, which substantially overcome one or more of the problems due to the limitations and disadvantages of the related art.

It is therefore a feature of an embodiment to provide an OLED display using a capacitor having a first electrode with an impurity-doped polycrystalline silicon and a second electrode with a structure providing enhanced electric characteristics to the capacitor.

It is therefore another feature of an embodiment to provide a method of manufacturing an OLED display with a capacitor having a first electrode with an impurity-doped polycrystalline silicon and a second electrode with a structure providing enhanced electric characteristics to the capacitor, thereby simplifying a doping process of the first capacitor electrode.

At least one of the above and other features and advantages may be realized by providing an OLED display, including a substrate main body, a semiconductor layer and a first capacitor electrode on the substrate main body, bottom surfaces of the semiconductor layer and first capacitor electrode being substantially coplanar, and each of the semiconductor layer and first capacitor electrode including an impurity-doped polysilicon layer, a gate insulating layer on the semiconductor layer and the first capacitor electrode, a gate electrode on the semiconductor layer with the gate insulating layer therebetween, and a second capacitor electrode on the first capacitor electrode with the gate insulating layer therebetween, the second capacitor electrode including a convex electrode portion and a concave electrode portion, the concave electrode portion being thinner than each of the convex electrode portion and the gate electrode.

The gate electrode and the second capacitor electrode may include the same metal, and the metal may include at least one of molybdenum (Mo), chromium (Cr), and tungsten (W).

The gate electrode may be thicker than about 170 nm, and the concave electrode portion of the second capacitor electrode may have a thickness that is less than about 75% of the thickness of the gate electrode.

The convex electrode portion of the second capacitor electrode may have the same thickness as the gate electrode.

The impurity doped to the first capacitor electrode and the semiconductor layer may be one of a P-type impurity and an N-type impurity.

The impurity may include boron.

The semiconductor layer may be divided into a channel region that is overlapped on the gate electrode and a source region and a drain region formed on both sides of the channel region. The channel region of the semiconductor layer may be an intrinsic semiconductor, and the source region and the drain region of the semiconductor layer and the first capacitor electrode may be impurity semiconductors.

The first capacitor electrode may include an implantation region overlapping the concave electrode portion of the second capacitor electrode and an expanded implantation region adjacent to the implantation region, the expanded implantation region extending laterally from the implantation region.

The convex electrode portion of the second capacitor electrode may have a width that is smaller than or equal to twice a width of the expanded implantation region, the width of the expanded implantation region extending from the implantation region in a direction parallel to the first capacitor electrode.

The concave electrode portion of the second capacitor electrode may have a thickness within the range of about 10 nm to about 140 nm.

The concave electrode portion and the convex electrode portion of the second capacitor electrode may be arranged in a stripe pattern.

The concave electrode and the convex electrode of the second capacitor electrode may be arranged in a lattice pattern.

The concave electrode portion and the convex electrode portion of the second capacitor electrode may be arranged alternately to overlap an entire length of the first capacitor electrode.

A width of the concave electrode portion may be equal to or larger than a width of the convex electrode portion.

At least one of the above and other features and advantages may also be realized by providing a method for manufacturing an OLED display, including forming a polysilicon layer on a substrate main body, forming a semiconductor layer intermediate and a first capacitor electrode intermediate by patterning the polysilicon layer, forming a gate insulating layer on the semiconductor layer intermediate and the first capacitor electrode intermediate, forming a gate electrode on the gate insulating layer so as to be partially overlapped on the semiconductor layer intermediate, forming a second capacitor electrode so as to be overlapped on the first capacitor electrode intermediate, and forming a semiconductor layer and a first capacitor electrode by doping an impurity to the semiconductor layer intermediate and the first capacitor electrode intermediate. The second capacitor electrode may include a convex electrode that is relatively thick and a concave electrode that is relatively thin. The concave electrode may be relatively thinner than the gate electrode, and the impurity is transmitted to the second capacitor electrode and is doped to the first capacitor electrode.

The gate electrode and the second capacitor electrode may include the same metallic material, and the metallic material may include one of molybdenum (Mo), chromium (Cr), and tungsten (W).

The gate electrode is thicker than 170 nm, and the concave electrode of the second capacitor electrode may have a thickness that is less than about 75% of the thickness of the gate electrode.

The convex electrode of the second capacitor electrode may have the same thickness as the gate electrode.

The concave electrode of the second capacitor electrode may have a thickness within the range of about 10 nm to about 140 nm.

The semiconductor layer is divided into a channel region that may overlap the gate electrode and a source region and a drain region formed on both sides of the channel region. The channel region of the semiconductor layer may be an intrinsic semiconductor, and the source region and the drain region of the semiconductor layer and the first capacitor electrode may be impurity semiconductors.

A region in which the impurity is doped to the first capacitor electrode may be divided into an implantation region that is overlapped on the concave electrode of the second capacitor electrode and an expanded implantation region that is near the implantation region. The expanded implantation region may be extended from the implantation region while the impurity is doped.

The convex electrode of the second capacitor electrode may have a width that is less than or equal to twice the distance that is generated when the expanded implantation region is expanded in one direction parallel to the first capacitor electrode from the implantation region.

The impurity may be one of a P-type impurity and an N-type impurity. The impurity may include boron.

The impurity may be ion implanted with energy of greater than about 30 keV and a dose amount of greater than about $1.0e12$ atoms/cm$^2$.

The gate electrode and the second capacitor electrode may be formed by patterning the gate metal layer through a photolithography process using a photosensitive layer pattern after forming a gate metal layer on the gate insulating layer.

The photosensitive layer pattern may include a first part provided on the gate electrode and a second part provided on the second capacitor electrode.

The second part of the photosensitive layer may be divided into a convex part having the same thickness as the first part and a concave part that is thinner than the convex part.

The gate electrode and the first capacitor electrode intermediate may be formed by etching the gate metal layer through the photosensitive layer pattern, the concave part of the second part of the photosensitive layer pattern is eliminated, and the first capacitor electrode intermediate is partially etched to form the capacitor electrode. The photosensitive layer pattern may be formed by using halftone exposure or dual exposure.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
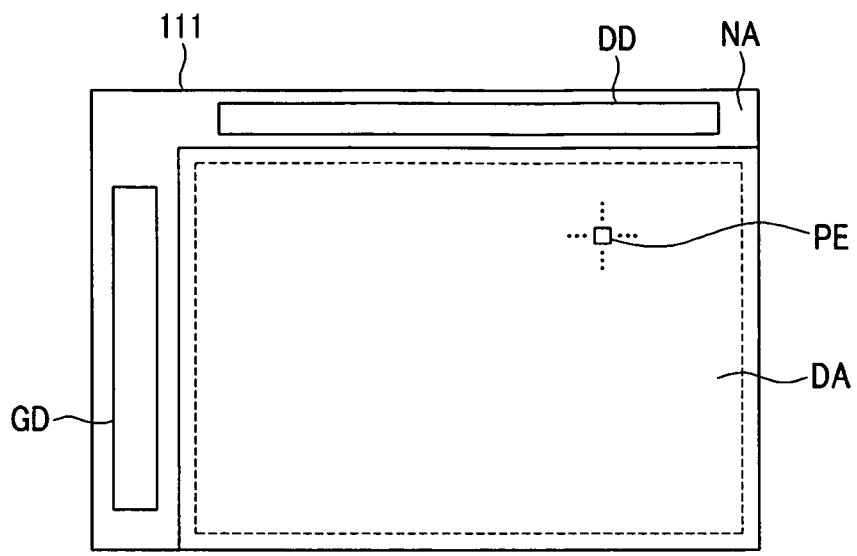
FIG. 1 illustrates a top plan view of an OLED display according to an exemplary embodiment.

Korean Patent Application No. 10-2010-0019045, filed on Mar. 3, 2010, in the Korean Intellectual Property Office, and entitled: "Organic Light Emitting Diode Display and Manufacturing Method Thereof," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer (or element) is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

An OLED display 101 according to an exemplary embodiment will now be described with reference to FIG. 1 to FIG. 3.

As illustrated in FIG. 1, the OLED display 101 may include a substrate main body 111 with a display area DA and a non-display area NA. A plurality of pixels (PE) are formed in the display area DA of the substrate main body 111 so as to display images, and one or more driving circuits, e.g., driving circuits GD and DD, are formed in the non-display area (NA), e.g., the driving circuits GD and DD may include TFTs. However, exemplary embodiments are not limited to the above, e.g., the driving circuits GD and DD may be omitted. An exemplary pixel circuit will be explained hereinafter with reference to FIG. 2.

Figure 2:
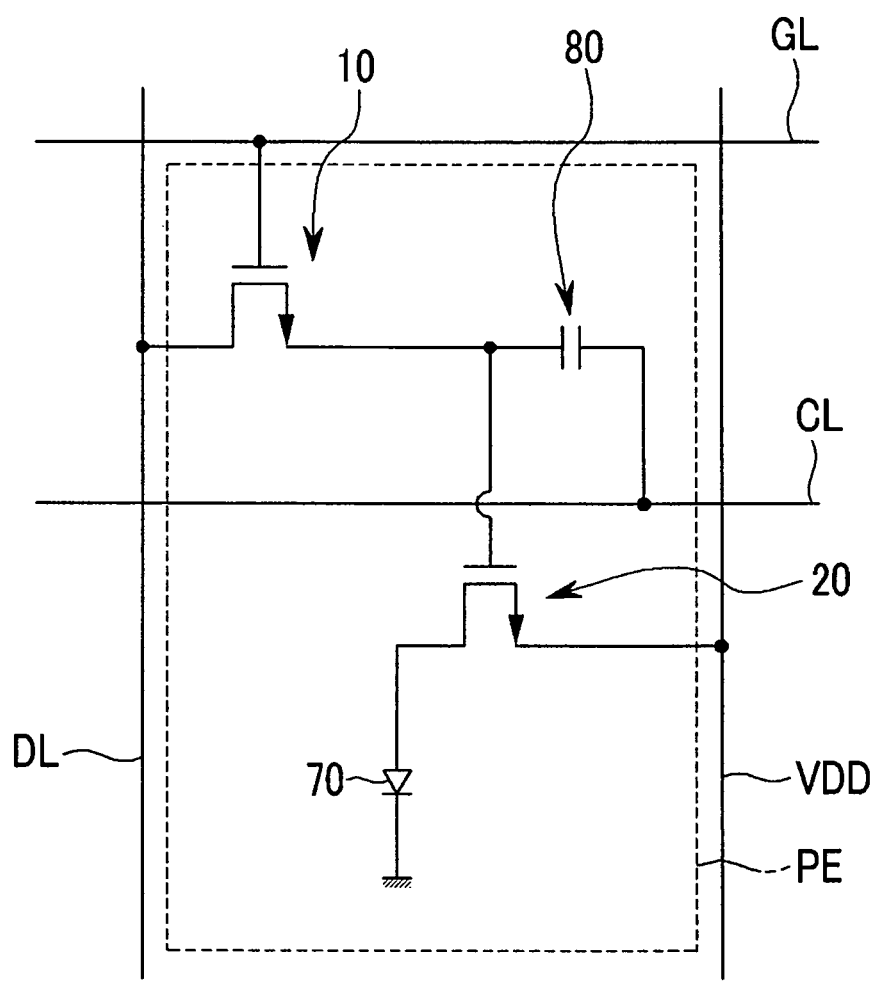
FIG. 2 illustrates a circuit diagram of a pixel circuit in the OLED display of FIG. 1.

Referring to FIG. 2, one pixel PE may have a 2Tr-1Cap structure with an organic light emitting element, e.g., an OLED 70, first and second TFTs 10 and 20, and a capacitor 80. However, an exemplary embodiment is not limited thereto. The OLED display 101 may be variously structured, e.g., three or more TFTs and two or more capacitors may be provided at one pixel PE together with a separate wire. The additional TFTs and capacitors may define a compensation circuit.

The compensation circuit improves the uniformity of the OLED 70 formed at each pixel PE, and prevents deviation of the image quality. The compensation circuit may include two to eight TFTs.

The OLED 70 may include an anode being a hole injection electrode, a cathode being an electron injection electrode, and an organic emissive layer disposed between the anode and the cathode.

Each of the first and second TFTs 10 and 20 may include a gate electrode, a semiconductor layer, a source electrode, and a drain electrode. In at least one of the first and second TFTs 10 and 20, the semiconductor layer may include an impurity-doped polycrystalline silicon layer. That is, at least one of the first and second TFTs 10 and 20 is a polycrystalline silicon TFT.

FIG. 2 illustrates a structure with a gate line GL, a data line DL, a common power line VDD, and a capacitor line CL. However, an exemplary embodiment is not limited to the structure illustrated in FIG. 2, e.g., the capacitor line CL may be omitted as needed.

A source electrode of the first TFT 10 is connected to the data line DL, and a gate electrode of the first TFT 10 is connected to the gate line GL. A drain electrode of the first TFT 10 is connected to the capacitor line CL via the capacitor 80. A node is formed between the drain electrode of the first TFT 10 and the capacitor 80, and the gate electrode of the second TFT 20 is connected to the node. The common power line VDD is connected to the drain electrode of the second TFT 20, and the anode electrode of the OLED 70 is connected to the source electrode of the second TFT 20.

The first TFT 10 is used as a switch for selecting a target pixel PE to be excited. When the first TFT 10 turns on, the capacitor 80 is charged. At this time, the amount of charges is proportional to the potential of the voltage applied from the data line DL. When the first TFT 10 turns off and signals are input into the capacitor line CL while increasing the voltage by a cycle of one frame, the gate potential of the second TFT 20 is increased along with the voltage applied through the capacitor line CL, based on the potential of the capacitor 80. When the gate potential of the second TFT 20 goes over the threshold voltage, the second TFT 20 turns on. Then, the voltage applied to the common power line VDD is applied to the OLED 70 through the second TFT 20 so that the OLED 70 emits light. The structure of the pixel PE is not limited to the above, but may be variously modified provided that such modifications can be easily appreciated and made by a person skilled in the art.

Figure 3:
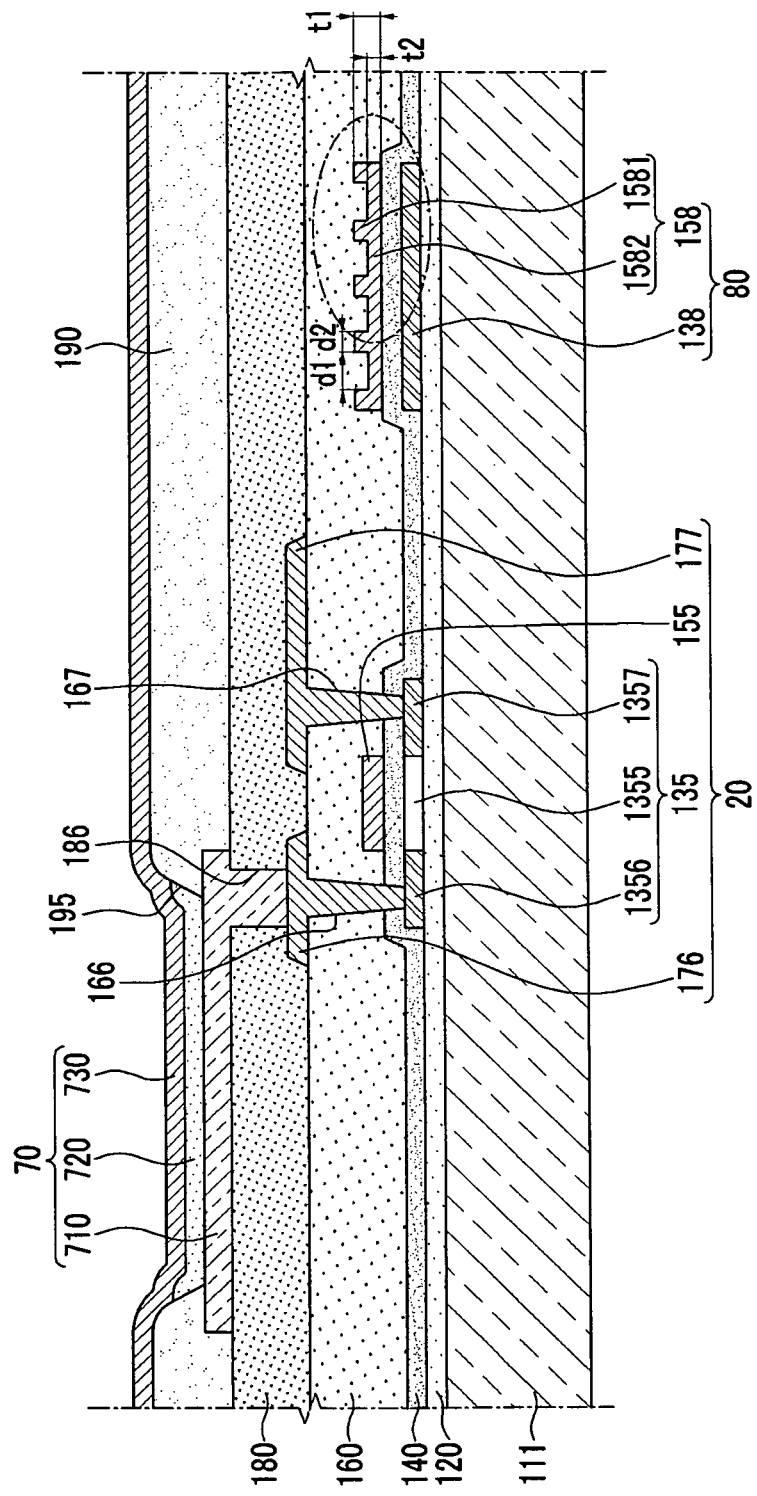
FIG. 3 illustrates a partially enlarged cross-sectional view of the OLED display of FIG. 1.

Referring to FIG. 3, the OLED display 101 according to an exemplary embodiment will now be described in detail with respect to structures and deposition sequence of the second TFT 20 and the capacitor 80. The second TFT 20 will be referred to hereinafter as the TFT.

The substrate main body 111 may be formed with an insulating substrate, e.g., may include glass, quartz, ceramic, and/or plastic. However, an exemplary embodiment is not limited thereto, e.g., the substrate main body 111 may be formed as a metallic substrate including stainless steel.

A buffer layer 120 may be formed on the substrate main body 111. For example, the buffer layer 120 may be formed as a single-layered structure including silicon nitride ($SiN_x$), or as a double-layered structure including $SiN_x$ and silicon oxide ($SiO_2$). The buffer layer 120 may prevent unneeded components, e.g., impure elements or moisture, from penetrating into the substrate main body 111 while flattening a surface thereof. However, the buffer layer 120 is not necessarily required, and may be omitted depending upon the kind and processing conditions of the substrate main body 111.

A semiconductor layer 135 and a first capacitor electrode 138 may be formed, e.g., simultaneously, on the buffer layer 120. That is, the semiconductor layer 135 and the first capacitor electrode 138 may be formed on a same plane, e.g., bottom surfaces of the semiconductor layer 135 and the first capacitor electrode 138 may face the substrate main body 111 and may be substantially coplanar. Each of the semiconductor layer 135 and the first capacitor electrode 138 may include an impurity-doped polycrystalline silicon layer.

In detail, the semiconductor layer 135 may include a channel region 1355, and source and drain regions 1357 and 1356 formed at both sides of the channel region 1355, respectively. The channel region 1355 of the semiconductor layer 135 may be formed of a non-doped polycrystalline silicon layer, i.e., of an intrinsic semiconductor. The source and drain regions 1357 and 1356 of the semiconductor layer 135 may be formed of an impurity-doped polycrystalline silicon layer, i.e., of an extrinsic or impurity semiconductor. The first capacitor electrode 138 may be formed of an impurity-doped polycrystalline silicon layer substantially like the source and drain regions 1357 and 1356 of the semiconductor layer 135. That is, the first capacitor electrode 138 may be completed together with the completion of the source and drain regions 1357 and 1356 of the semiconductor layer 135.

The impurity doped at the source and drain regions 1357 and 1356 of the semiconductor layer 135 and the first capacitor electrode 138 may be any one of a P-type impurity, e.g., ions of boron (B), $B_2H_5$, etc., and an N-type impurity. The impurity may be differentiated in kind depending upon the TFT 20. The impurities may be doped into the polycrystalline silicon layer so as to form the source and drain regions 1357 and 1356 of the semiconductor layer 135, and the first capacitor electrode 138.

A gate insulating layer 140 may be formed on the semiconductor layer 135 and the first capacitor electrode 138. The gate insulating layer 140 may be formed of at least one of tetraethyl orthosilicate (TEOS), $SiN_x$, and $SiO_2$. For example, the gate insulating layer 140 may be formed as a double-layered structure sequentially having a silicon nitride layer with a thickness of about 40 nm, and a TEOS layer with a thickness of about 80 nm. However, in an exemplary embodiment, the gate insulating layer 140 is not limited to the above-described structure.

A gate electrode 155 and a second capacitor electrode 158 may be formed on the gate insulating layer 140. The gate electrode 155 and the second capacitor electrode 158 may be formed of a substantially same metallic material, and may be positioned on a same plane, e.g., bottom surfaces of the gate electrode 155 and the second capacitor electrode 158 may be substantially coplanar and may be directly on the gate insulating layer 140. Examples of the metallic material may include one or more of molybdenum (Mo), chromium (Cr), and tungsten (W), e.g., the gate electrode 155 and the second capacitor electrode 158 may be formed of molybdenum (Mo) or a molybdenum alloy.

The gate electrode 155 may be formed on the semiconductor layer 135, such that it may overlap the channel region 1355 of the semiconductor layer 135. The gate electrode 155 may have a first thickness t1, e.g., the gate electrode 155 may have a thickness of about 170 nm or more in order to provide sufficient thickness to prevent impurities from being doped into the channel region 1355 during impurity implantation into the source and drain regions 1357 and 1356 of the semiconductor layer 135. Accordingly, if the gate electrode 155 has a thickness of less than 170 nm, impurities may penetrate through the gate electrode 155 into the channel region 1355 of the semiconductor layer 135. That is, if the gate electrode 155 has a thickness of less than 170 nm, the gate electrode 155 may not properly prevent impurities from being doped into the channel region 1355 of the semiconductor layer 135.

Figure 4:
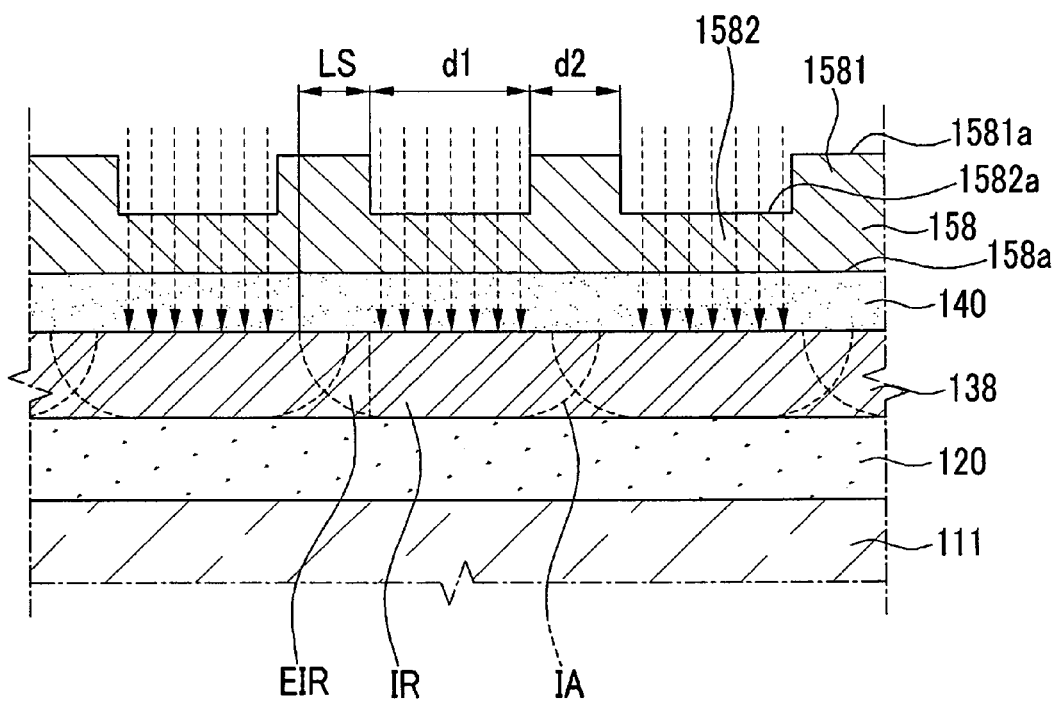
FIG. 4 illustrates a partially enlarged cross-sectional view of a capacitor in FIG. 3.

The second capacitor electrode 158 may be formed on the first capacitor electrode 138. The second capacitor electrode 158 may include a convex electrode portion 1581 that is relatively thick and a concave electrode portion 1582 that is relatively thin. The convex electrode portion 1581 of the second capacitor electrode 158 may have the first thickness t1, i.e., may have a substantially same thickness as the gate electrode 155 along a direction normal to the main body substrate 111, and the concave electrode portion 1582 of the second capacitor electrode 158 may have a second thickness t2 that is relatively thinner than that first thickness t1, e.g., the second thickness t2 may be within a range of about 10 nm to about 140 nm. For example, the concave electrode portion 1582 of the second capacitor electrode 158 may have a thickness that is below about 75% of the thickness of the gate electrode 155, e.g., $t2<0.75 \cdot t1$. For example, as illustrated in FIG. 4, a bottom surface 158a of the second capacitor electrode 158 may be substantially flat, so bottom surfaces of the convex and concave electrode portions 1581 and 1582 may be substantially coplanar to define a uniform bottom surface 158a. Top surfaces 1581a and 1582a of the respective convex and concave electrode portions 1581 and 1582, however, may be at different distances from the bottom surface 158a to define the different first and second thicknesses t1 and t2. For example, the convex and concave electrode portions 1581 and 1582 may be arranged alternately along a horizontal direction on, e.g., directly on, the insulating layer 140 to overlap an entire length of the first electrode 138 along the horizontal direction.

In detail, impurities may be doped into the first capacitor electrode 138 by passing through the second capacitor electrode 158. Therefore, when a conventional second capacitor electrode is too thick, the impurity may not pass through the second capacitor electrode into the first capacitor electrode, thereby causing defects in the first capacitor electrode due to inappropriate conductivity. When the second capacitor electrode is too thin, the electric characteristic of the second capacitor electrode may be degraded, thereby reducing capacitance of the capacitor. However, as the second capacitor electrode 158 according to example embodiments includes convex and concave electrode portions 1581 and 1582 with different thicknesses, enhanced electrical properties of both first and second capacitor electrodes may be achieved. That is, even if the concave electrode portion 1582 is thin, the convex electrode portion 1581 having the same thickness as the gate electrode 155 may provide appropriate electric characteristic to the second electrode 158 of the capacitor 80. Similarly, even if the convex electrode portion 1581 is thick, the concave electrode portion 1582 having a small thickness may facilitate doping of the first electrode 138, thereby providing appropriate electrical characteristics to the first electrode 138.

Further, the concave electrode portion 1582 of the second capacitor electrode 158 may have a first width d1, i.e., a distance as measured along a horizontal direction between two adjacent convex electrode portions 1581, and the convex electrode portion 1581 may have a second width d2, e.g., a distance as measured along a horizontal direction between two adjacent concave electrode portions 1581. The first width d1 of the concave electrode portion 1582 may be greater than or equal to the second width d2 of the convex electrode portion 1581. However, the exemplary embodiment is not limited thereto. For example, the convex electrode portion 1581 may have the second width d2 within a range of about 100 nm to about 500 nm. When the second width d2 of the convex electrode portion 1581 is formed to be too great, the convex electrode portion 1581 may excessively prevent the impurity doping, thereby reducing conductivity of the first capacitor electrode 138. When the second width d2 of the convex electrode portion 1581 is formed to be too narrow, it may be difficult for the second capacitor electrode 158 to acquire an appropriate electric characteristic. In consideration of the conditions, the convex electrode portion 1851 may have the second width d2 within the range of about 100 nm to about 500 nm, and it may be efficient for the concave electrode portion 1582 to have the first width d1 to be the same as or greater than that of the convex electrode portion 1581. Doping of the first electrode 138 through the concave electrode portion 1582 will be explained in more detail below with reference to FIG. 4.

In this way, when the second capacitor electrode 158 is formed on the first capacitor electrode 138 by interposing the gate insulating layer 140 therebetween, the capacitor 80 according to an exemplary embodiment may be completed. The gate insulating layer 140 becomes a dielectric of the capacitor 80.

Referring to FIG. 4, a region in which the impurity is doped into the first capacitor electrode 138 is classified as an implantation region IR, and may overlap, e.g., completely overlap, the concave electrode portion 1582 of the second capacitor electrode 158. Further, an expanded implantation region EIR may be formed in the first capacitor electrode 138 near the implantation region IR, e.g., the expanded implantation region EIR may overlap at least a part of the convex electrode portion 1581 of the second capacitor electrode 158. The impurity may be doped simultaneously, e.g., through the same doping process, into the implantation region IR and the expanded implantation region EIR. That is, during doping of the implantation region IR overlapping the concave electrode portion 1582, dopants, i.e., impurities, may spread laterally away from the implantation region IR, e.g., along the horizontal direction, to form the expanded implantation region EIR overlapping the convex electrode portion 1581. Therefore, while the impurity is doped to the implantation region IR, the same is simultaneously and incidentally doped to the expanded implantation region EIR. Reference character IA in FIG. 4 illustrates combined boundaries of the implantation and expanded implantation regions IR and EIR, i.e., a region within the first capacitor electrode 138 that is doped via a single concave electrode portion 1582 of the second capacitor electrode 158.

As the implantation region IR overlaps the concave electrode portion 1582, the implantation region IR may have the first width d1 of the concave electrode portion 1582. The expanded implantation region EIR may have a width LS, i.e., a distance that is generated when the expanded implantation region EIR is expanded in one direction parallel to the first capacitor electrode 138 from the implantation region IR. For example, the second width d2 of the convex electrode portion may be smaller than or equal to twice the distance LS, i.e., $d2 \leq 2 \cdot LS$. A width of the region IA, i.e., as measured along an upper surface of the first electrode 138 facing the insulation layer 140, may equal a sum of the first width d1 and two widths LS. Accordingly, the first capacitor electrode 138 may be a stable conductor.

Figure 5:
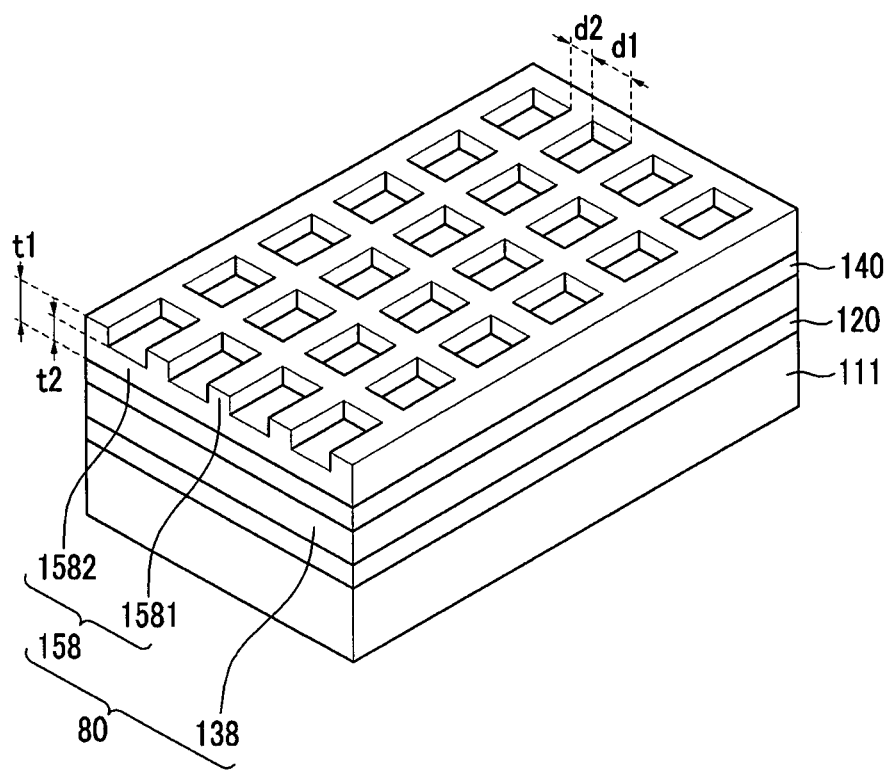
FIG. 5 illustrates a partial perspective view of a capacitor in FIG. 3.

FIG. 5 illustrates the capacitor 80 that is formed on the substrate main body 111 according to an exemplary embodiment. As shown in FIG. 5, the second capacitor electrode 158 may have concave and convex electrode portions 1582 and 1581 arranged in a lattice pattern.

Figure 6:
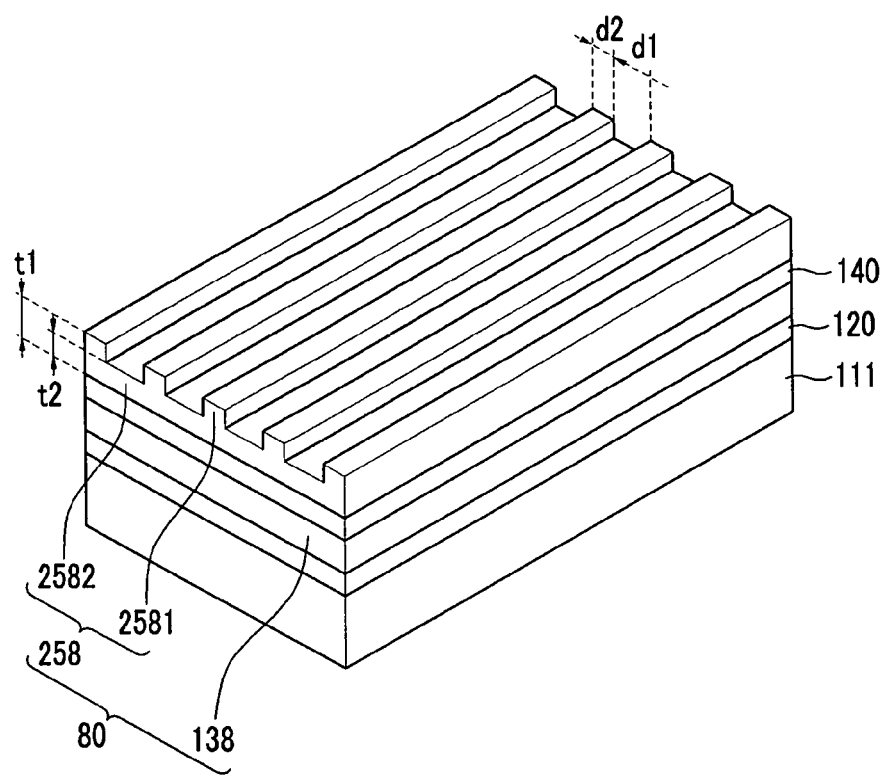
FIG. 6 illustrates a partial perspective view of a capacitor in an OLED display according to another exemplary embodiment.

However, the exemplary embodiment is not limited thereto. For example, as illustrated in FIG. 6, a second capacitor electrode 258 may be formed to be a concave and convex shape of a stripe pattern. That is, a convex electrode portion 2581 and a concave electrode portion 2582 of the second capacitor electrode 258 may be arranged in a stripe pattern. Also, even though not shown, the second capacitor electrode 258 may be formed in the concave and convex shape with various patterns in addition to the lattice pattern and the stripe pattern.

Referring back to FIG. 3, an interlayer insulating layer 160 may be formed on the gate electrode 155 and the second capacitor electrode 158. The interlayer insulating layer 160 may be formed of one or more of TEOS, $SiN_x$, and $SiO_x$ in a like manner of the gate insulating layer 140, but is not limited thereto.

The interlayer insulating layer 160 and the gate insulating layer 140 may have a source contact hole 167 and a drain contact hole 166 therethrough for partially displaying a source region 1357 and a drain region 1356 of the semiconductor layer 135.

A source electrode 177 and a drain electrode 176 contacting the source region 1357 and the drain region 1356 of the semiconductor layer 135, respectively, through the source contact hole 167 and the drain electrode hole 166 may be formed on the interlayer insulating layer 160. In this way, the TFT 20 according to the exemplary embodiment may be completed.

Further, although not shown, an additional capacitor electrode formed with the same material on the same source electrode 177 and the drain electrode 176 may be disposed on the interlayer insulating layer 160. In this case, the additional capacitor may be formed to overlap at least one of the first capacitor electrode 138 and the second capacitor electrode 158. Accordingly, when the additional capacitor electrode is disposed, the capacitor 80 may have a dual structure to further improve capacitance.

A planarization layer 180 for covering the source electrode 177 and the drain electrode 176 may be formed on the interlayer insulating layer 160. The planarization layer 180 may planarize, i.e., remove steps and smooth the same, so as to provide a substantially flat surface and increase luminous efficiency of the OLED 70 to be formed thereon. Also, the planarization layer 180 may include an anode contact hole 186 for exposing a part of the drain electrode 176.

The planarization layer 180 may include at least one of a polyacrylate resin, an epoxy resin, a phenolic resin, a polyamide resin, a polyimide resin, an unsaturated polyester resin, a polyphenylenether resin, a polyphenylenesulfide resin, and a benzocyclobutene (BCB) resin.

A pixel electrode 710 of the OLED 70 may be formed on the planarization layer 180. Here, the pixel electrode 710 represents an anode. The pixel electrode 710 may be connected to the drain electrode 176 through the anode contact hole 186 of the planarization layer 180.

Also, a pixel defined layer 190 having an opening 195 for showing the pixel electrode 710 may be formed on the planarization layer 180. That is, the pixel electrode 710 may be disposed to correspond to the opening 195 of the pixel defined layer 190. The pixel defined layer 190 may include a polyacrylate or polyimide resin and a silica-based inorganic matter.

An organic emission layer 720 may be formed on the pixel electrode 710 in the opening 195 of the pixel defined layer 190, and a common electrode 730 may be formed on the pixel defined layer 190 and the organic emission layer 720. Here, the common electrode 730 indicates a cathode. Accordingly, the OLED 70 including the pixel electrode 710, the organic emission layer 720, and the common electrode 730 may be formed.

The OLED display 101 may be a front display type, a rear display type, or a front and rear display type according to the direction in which the OLED 70 emits light. When the OLED display 101 is a front display type display, the pixel electrode 710 may be formed with a reflective layer and the common electrode 730 may be formed with a semi-transmissive layer. However, when the OLED display 101 is a rear display type display, the pixel electrode 710 may be formed with a semi-transmissive layer and the common electrode 730 may be formed with a reflective layer. Further, when the OLED display 101 is a front and rear display type, the pixel electrode 710 and the common electrode 730 may be formed with a transmissive layer or a semi-transmissive layer.

The reflective layer and the semi-transmissive layer may be made of, e.g., at least one of magnesium (Mg), silver (Ag), gold (Au), calcium (Ca), lithium (Li), chromium (Cr), and aluminum (Al), or alloys thereof. In this case, the reflective layer and the semi-transmissive layer are determined by thickness. In general, the semi-transmissive layer has a thickness that is less than about 200 nm. The semi-transmissive layer increases transmittance of light as the thickness is reduced, and the transmittance of light is reduced as the thickness is increased.

The transmissive layer may be made of, e.g., indium tin oxide (ITO), indium zinc oxide (IZO), zinc oxide (ZnO), or indium oxide ($In_2O_3$).

The organic emission layer 720 may be formed as a multilayer structure including at least one of an emission layer, a hole injection layer (HIL), a hole transport layer (HTL), an electron transport layer (ETL), and an electron injection layer (EIL). When the organic emission layer 720 includes all of the above listed layers, the HIL may be disposed on the pixel electrode 710 that is the anode, and the HTL, the emission layer, the ETL, and the EIL may be sequentially stacked thereon. Further, the organic emission layer 720 may include another layer if needed.

According to example embodiments, the OLED display 101 may efficiently use an impurity-doped polysilicon layer as a first electrode 138 of the capacitor 80. That is, since the impurity may efficiently pass through, e.g., only through, the concave electrode portion 1582 of the second capacitor electrode 158 that is disposed on the first capacitor electrode 138, the first capacitor electrode 138 may be easily formed with the impurity-doped polysilicon layer. That is, the first capacitor electrode 138 may be easily formed without an additional process during the process of forming the semiconductor layer 135, while both first and second capacitor electrodes 138 and 158 exhibit good electric properties.

Hence, the overall process of manufacturing the OLED display 101 may be efficiently simplified. In contrast, when a conventional capacitor is formed to include an impurity-doped silicon layer, a separate doping mask process may be required for forming the doped capacitor electrode. Such an additional process may involve complicated processing steps and increased production costs.

A method for manufacturing the OLED display 101 according to an exemplary embodiment will now be described with reference to FIG. 7 to FIG. 14.

Figure 7:
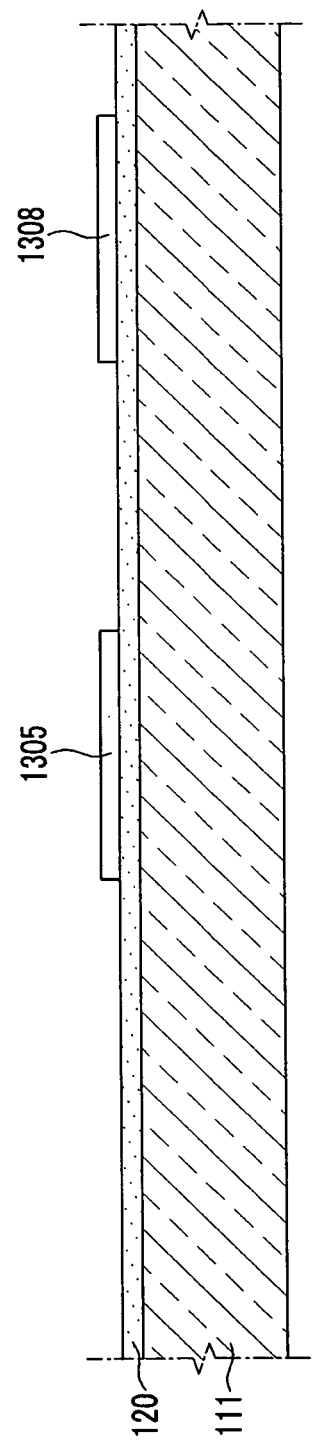
FIG. 7 to FIG. 14 illustrate cross-sectional views of stages in a process for manufacturing an OLED display according to an exemplary embodiment.

First, as shown in FIG. 7, the buffer layer 120 may be formed on the substrate main body 111. The buffer layer 120 may be formed on the substrate main body 111 of an inorganic insulating matter, e.g., $SiN_x$ and/or $SiO_2$, by, e.g., plasma enhanced chemical vapor deposition (PECVD).

Next, a polysilicon layer may be formed on the buffer layer 120. The polysilicon layer may be formed by forming an amorphous silicon layer and crystallizing the same. The amorphous silicon layer may be formed, e.g., by PECVD. Moreover, as the method of crystallizing the amorphous silicon film, various methods known to those skilled in the art can be used. For example, the amorphous silicon layer may be crystallized by using heat, laser, Joule heat, an electric field, a catalytic metal, or the like. Furthermore, a dehydrogenation process for removing hydrogen atoms existing in the amorphous silicon film may be carried out prior to crystallization. The polysilicon layer may be patterned, e.g., before or after crystallization, by photolithography to form a semiconductor layer intermediate 1305 and a first capacitor electrode intermediate 1308.

Figure 8:
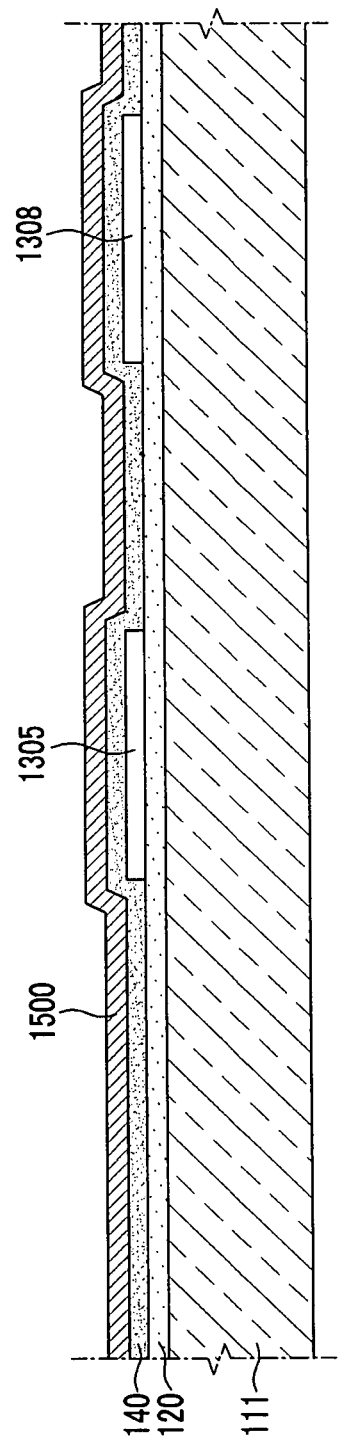

Next, as shown in FIG. 8, the gate insulating layer 140 may be formed on the semiconductor layer intermediate 1305 and the first capacitor electrode intermediate 1308. For example, the gate insulating layer 140 may include a silicon nitride layer having a thickness of about 40 nm and a TEOS layer having a thickness of about 80 nm formed thereon. The aforementioned inorganic films may be formed by a known method, e.g., PECVD.

Next, a gate metal layer 1500 may be formed on the gate insulating layer 140. The gate metal layer 1500 may include at least one of molybdenum (Mo), chromium (Cr), and tungsten (W). For example, the gate metal layer 1500 may be formed of molybdenum (Mo), e.g., by a sputtering method.

Figure 9:
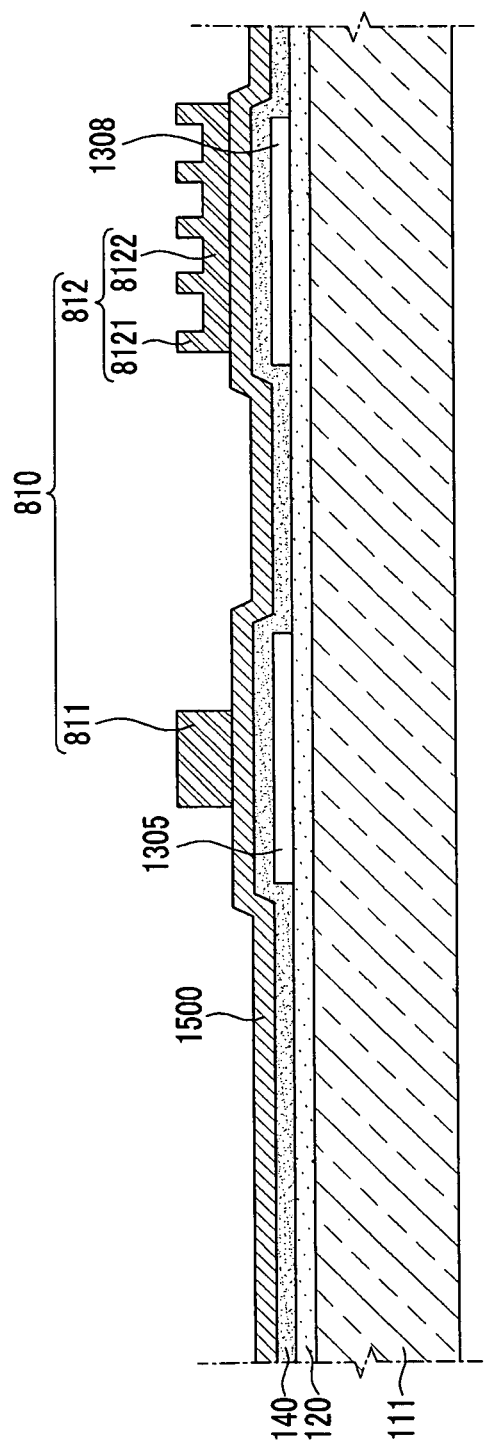

As shown in FIG. 9, a photosensitive material may be coated on the gate metal layer 1500 to form a photosensitive layer. The photosensitive layer may be exposed and developed to form a photosensitive layer pattern 810.

The photosensitive layer pattern 810 may include a first part 811 that is disposed at a position at which the gate electrode (155 in FIG. 3) will be formed, a second part 812 that is disposed at a position at which the second capacitor electrode (158 in FIG. 3) will be formed, and a third part between the first and second parts 811 and 812 for exposing the gate metal layer 1500. That is, the third part substantially has no photosensitive layer 800. Also, the second part 812 may include a convex part 8121 having the same thickness as the first part 811 and a concave part 8122 that is thinner than the first part 811.

The photosensitive layer pattern 810 may be formed by using the halftone exposure or dual exposure. The halftone exposure uses a single mask having a halftone region, and the dual exposure uses two masks to acquire the same effect as the halftone exposure.

Figure 10:
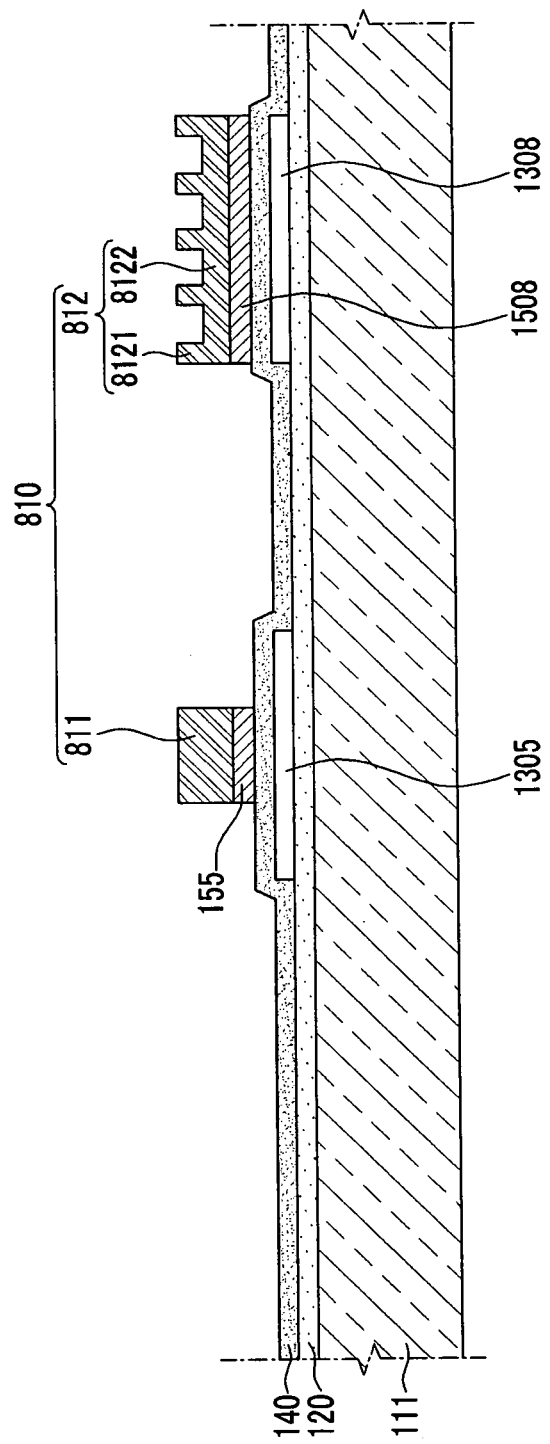

Next, as shown in FIG. 10, the gate metal layer 1500 may be etched through the etching process using the photosensitive layer pattern 810 to form the gate electrode 155 and the second capacitor electrode intermediate 1508.

Figure 11:
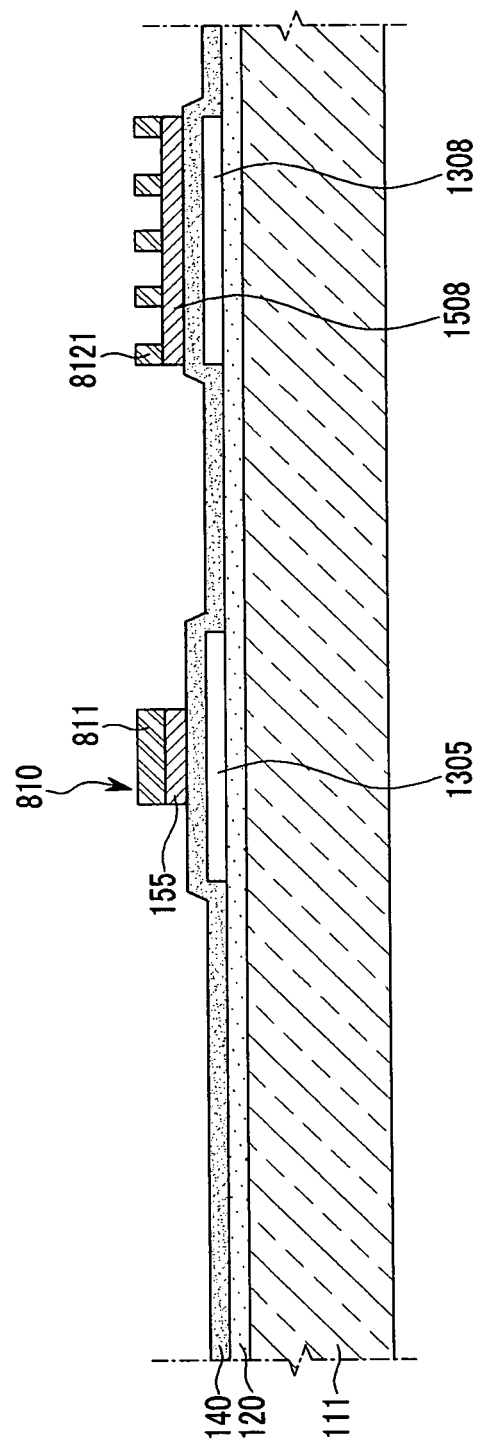

As shown in FIG. 11, the concave part 8122 of the second part 812 of the photosensitive layer pattern 810 is eliminated. In this case, the first part 811 of the photosensitive layer pattern 810 and the convex part 8121 of the second part become thinner by the thickness of the removed concave part 8122 of the second part 812.

Figure 12:
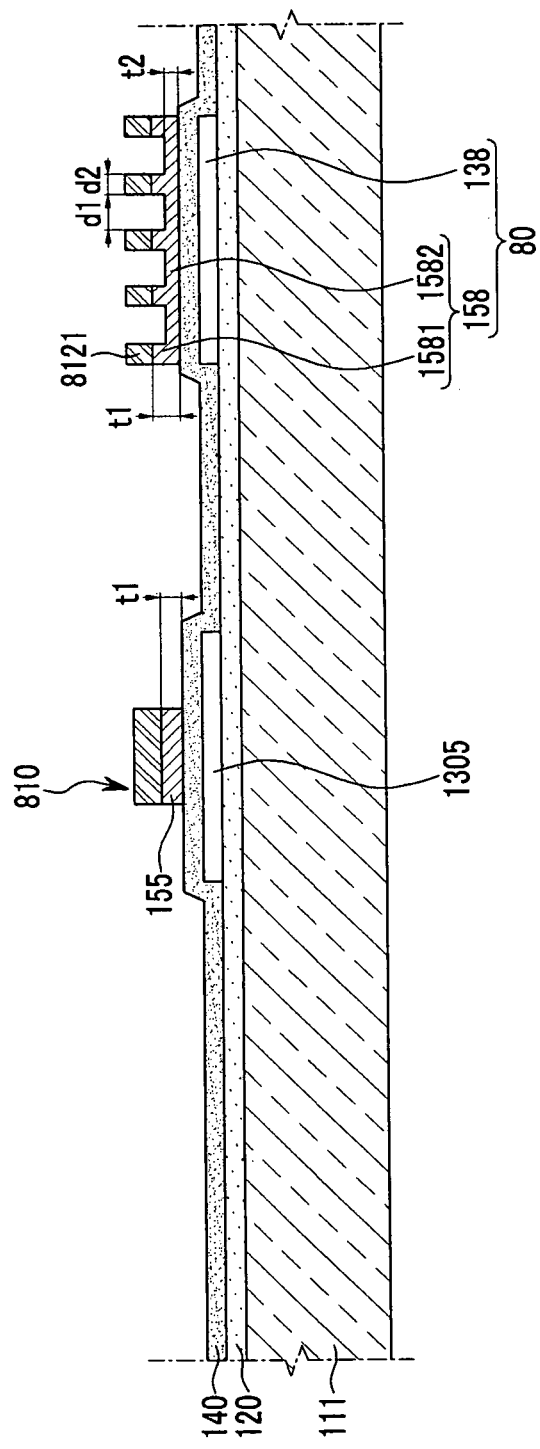

As shown in FIG. 12, the second capacitor electrode intermediate 1508 may be partially etched by using the photosensitive layer pattern 810 from which the concave part 8122 of the second part 812 is eliminated. The second capacitor electrode intermediate 1508 may be partially etched to become the second capacitor electrode 158. In this case, the second capacitor electrode 158 may include a convex electrode portion 1581 having the same thickness as the gate electrode 155 and a concave electrode portion 1582 that is relatively thinner than the gate electrode 155. The concave electrode portion 1582 may have the second thickness t2 within the range of about 10 nm to about 140 nm, and the gate electrode 155 and the convex electrode portion 1581 may have the first thickness t1 that is greater than about 170 nm. Also, the convex electrode portion 1581 may have a width within the range of about 100 nm to about 500 nm.

Figure 13:
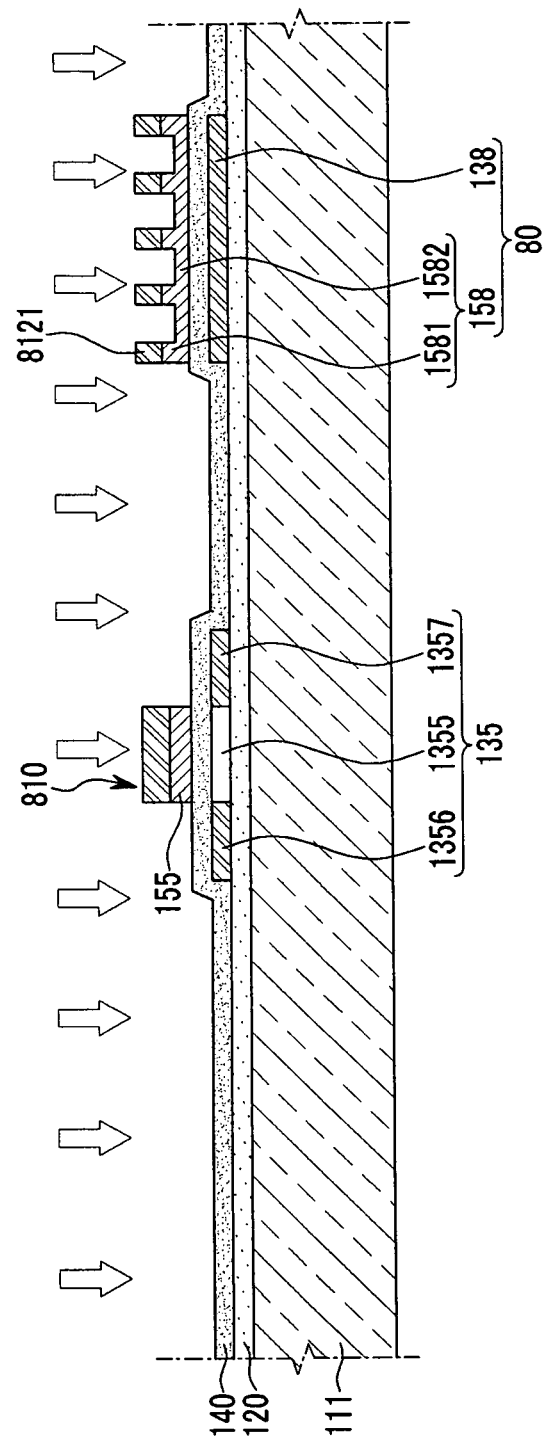

As shown in FIG. 13, an impurity may be doped to the semiconductor layer intermediate 1305 and the first capacitor electrode intermediate 1308 to form the semiconductor layer 135 and the first capacitor electrode 138. During this process, as the gate electrode 155 has a thickness that is greater than 170 nm, the gate electrode 155 prevents the channel region 1355 from being doped with the impurity when the impurity is doped into the source region 1357 and the drain region 1356 of the semiconductor layer 135. Therefore, the gate electrode 155 may stably prevent the impurity from being doped to the channel region 1355.

Accordingly, when the impurity is doped to the semiconductor layer intermediate 1305, a channel region 1355 overlapping the gate electrode 155, and a semiconductor layer 135 divided by the source region 1357 and the drain region 1356 formed on both sides of the channel region 1355, may be formed. That is, the channel region 1355 may be an intrinsic semiconductor, and the source region 1357 and the drain region 1356 may be impurity semiconductors.

Also, the first capacitor electrode 138 may be formed with an impurity-doped polysilicon layer in a like manner of the source region 1357 and the drain region 1356 of the semiconductor layer 135. However, the impurity doped to the first capacitor electrode intermediate 1308 is passed through the concave electrode portion 1582 of the second capacitor electrode 158 and is doped to the first capacitor electrode intermediate 1308. Therefore, when the concave electrode portion 1582 of the second capacitor electrode 158 is too thick, the impurity cannot pass through the concave electrode portion 1582 of the second capacitor electrode 158 and the first capacitor electrode 138 may not have appropriate conductivity and may become defective. Also, when the second capacitor electrode 158 is formed to be too thin, the electric characteristic of the second capacitor electrode 158 is degraded and the capacitor 80 becomes defective. In consideration of the problems, it is efficient for the second capacitor electrode 158, i.e., the concave electrode portion 1582, to have a thickness within the range of about 10 nm to about 140 nm.

The convex electrode portion 1581 of the second capacitor electrode 158 helps the second capacitor electrode 158 to maintain a suitable electric characteristic. Hence, the concave electrode portion 1582 may be stably formed to be thin while maintaining the overall electric characteristic of the second capacitor electrode 158. Also, it may be efficient for the concave electrode portion 1582 to have a width within the range of about 100 nm to about 500 nm in order to maintain the electric characteristic of the second capacitor electrode 158. Further, it may be efficient for the concave electrode portion 1582 to have a width that is greater than or equal to that of the convex electrode portion 1581 so as to acquire sufficient conductivity of the first capacitor electrode 138 by passing through the impurity.

When the impurity is doped as shown in FIG. 4, the impurity is implanted to the implantation region and the expanded implantation region of the first capacitor electrode 138. The expanded implantation region may be provided near the implantation region, and may be laterally expanded from the implantation region. In this case, the convex electrode portion 1581 of the second capacitor electrode 158 may have the width d2 that is less than or equal to twice the distance LS in which the expanded implantation region is straggled in the parallel direction of the first capacitor electrode 138 from one implantation region. Accordingly, the first capacitor electrode 138 may be a stable conductor.

Further, the impurity may be one of a P-type impurity and an N-type impurity. The impurity type is determined according to the type of the TFT 20. The impurity may be a P-type impurity like boron. In detail, the impurity may be $B_2H_5$, and boron ions may be doped to the first capacitor electrode 138.

Also, the impurity may be ion implanted into the first capacitor electrode 138 with energy that is greater than about 30 keV and a dose amount that is greater than about 1.0e12 atoms/cm$^2$, which is a condition that is set for the impurity to pass through the second capacitor electrode 158 and be efficiently doped to the first capacitor electrode 138.

Accordingly, the capacitor 80 including the first capacitor electrode 138 and the second capacitor electrode 158 that is formed on the first capacitor electrode 138 with a gate insulating layer 140 therebetween may be completed. Particularly, the first capacitor electrode 138 may be easily formed without an additional process during formation of the semiconductor layer 135. Therefore, the process for manufacturing the OLED display 101 may be simplified very efficiently.

Figure 14:
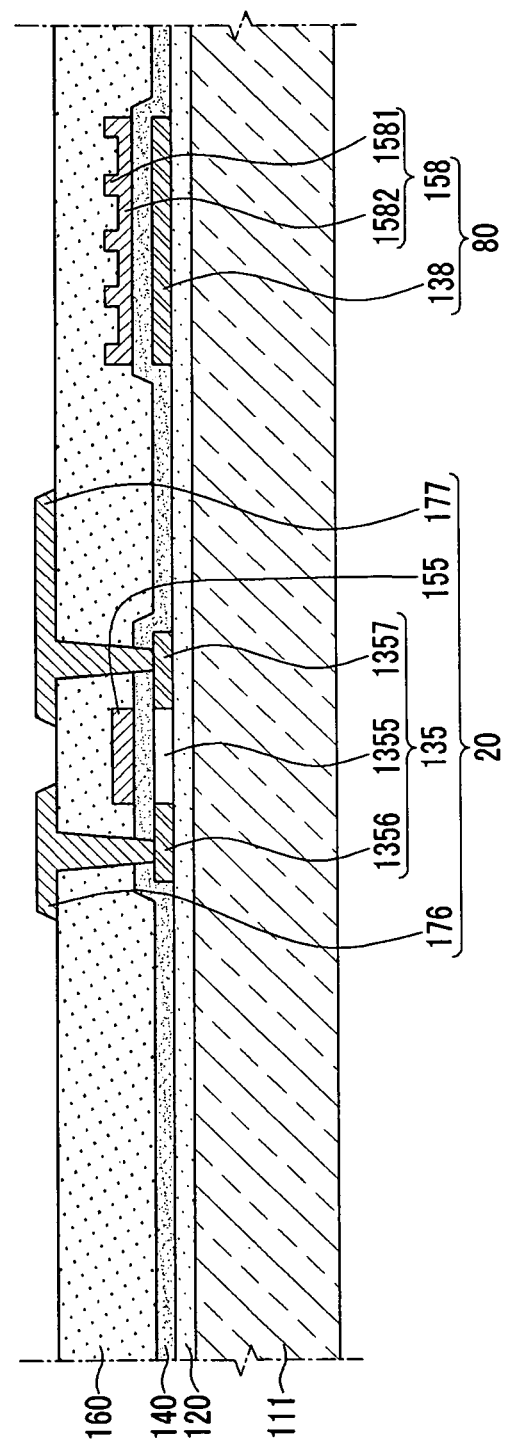

As shown in FIG. 14, the photosensitive layer pattern 810 on the gate electrode 155 and the convex electrode portion 1581 of the second capacitor electrode 158 may be removed, and an interlayer insulating layer 160 may be formed on the gate electrode 155 and the second capacitor electrode 158. Here, the photosensitive layer pattern 810 on the gate electrode 155 and the convex electrode portion 1581 of the second capacitor electrode 158 may be eliminated before the impurity is doped.

The interlayer insulating layer 160 may be formed by a known method, e.g., PECVD, by using at least one of, e.g., TEOS, SiN$_x$, and SiO$_x$, in a like manner of the gate insulating layer 140.

The interlayer insulating layer 160 and the gate insulating layer 140 may be etched through photolithography to form the source contact hole 167 and the drain contact hole 166 for partially showing the source region 1357 and drain region 1356 of the semiconductor layer 135.

The source electrode 177 and the drain electrode 176 may be formed on the interlayer insulating layer 160. In this case, the source electrode 177 and the drain electrode 176 may contact the source region 1357 and the drain region 1356 of the semiconductor layer 135 through the source contact hole 167 and drain contact hole 166, respectively.

Next, as shown in FIG. 3, the planarization layer 180 may be formed on the source electrode 177 and the drain electrode 176. In this case, the planarization layer 180 may include the anode contact hole 186 for showing the drain electrode 176.

The pixel electrode 710 may be formed on the planarization layer 180. The pixel electrode 710 may contact the drain electrode 176 through the anode contact hole 186. However, the exemplary embodiment is not restricted to the above description. Therefore, the planarization layer 180 may be omitted. When the planarization layer 180 is omitted, the drain electrode 176 becomes the pixel electrode 710.

The pixel defined layer 190 may be formed on the planarization layer 180. In this case, the pixel defined layer 190 may include the opening 195 for showing the pixel electrode 710. The organic emission layer 720 may be formed in the opening 195 of the pixel defined layer 190, and the common electrode 730 may be formed thereon to complete the organic light emitting element 70.

The OLED display 101 according to the exemplary embodiment may be manufactured through the above-described manufacturing method. That is, according to the exemplary embodiment, the manufacturing method of the OLED display 101 may be efficiently simplified.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode display, comprising:
a substrate main body;
a semiconductor layer and a first capacitor electrode on the substrate main body, bottom surfaces of the semiconductor layer and first capacitor electrode being substantially coplanar, and each of the semiconductor layer and first capacitor electrode including an impurity-doped polysilicon layer;
a gate insulating layer on the semiconductor layer and the first capacitor electrode;
a gate electrode on the semiconductor layer with the gate insulating layer therebetween; and
a second capacitor electrode on the first capacitor electrode with the gate insulating layer therebetween, the second capacitor electrode including a first electrode portion and a second electrode portion,
wherein the second electrode portion is thinner than each of the first electrode portion and the gate electrode.

2. The organic light emitting diode display as claimed in claim 1, wherein the gate electrode and the second capacitor electrode include a same metal, the metal including at least one of molybdenum (Mo), chromium (Cr), and tungsten (W).

3. The organic light emitting diode display as claimed in claim 2, wherein:
the gate electrode has a thickness of about 170 nm or more, and
the second electrode portion of the second capacitor electrode has a thickness larger than 0 nm and smaller than 75% of the thickness of the gate electrode.

4. The organic light emitting diode display as claimed in claim 3, wherein the first electrode portion of the second capacitor electrode has the same thickness as the gate electrode.

5. The organic light emitting diode display as claimed in claim 1, wherein the first capacitor electrode includes an implantation region overlapping the second electrode portion of the second capacitor electrode and an expanded implantation region adjacent to the implantation region, the expanded implantation region extending laterally from the implantation region.

6. The organic light emitting diode display as claimed in claim 5, wherein the first electrode portion of the second capacitor electrode has a width that is larger than zero and smaller than or equal to twice a width of the expanded implantation region, the width of the expanded implantation region extending from the implantation region in a direction parallel to the first capacitor electrode.

7. The organic light emitting diode display as claimed in claim 6, wherein the second electrode portion of the second capacitor electrode has a thickness within a range of about 10 nm to about 140 nm.

8. The organic light emitting diode display as claimed in claim 1, wherein a width of the second electrode portion is equal to or larger than a width of the first electrode portion, the widths extending in parallel to the bottom surface of the second capacitor electrode.

9. An organic light emitting diode display, comprising:
   a substrate main body;
   a semiconductor layer and a first capacitor electrode on the substrate main body, bottom surfaces of the semiconductor layer and first capacitor electrode being substantially coplanar, and each of the semiconductor layer and first capacitor electrode including an impurity-doped polysilicon layer;
   a gate insulating layer on the semiconductor layer and the first capacitor electrode;
   a gate electrode on the semiconductor layer with the gate insulating layer therebetween; and
   a second capacitor electrode on the first capacitor electrode with the gate insulating layer therebetween, the second capacitor electrode including a plurality of first electrode portions and a plurality of second electrode portions,
   wherein each of the second electrode portions are thinner than each of the first electrode portions and thinner than the gate electrode.

10. The organic light emitting diode display as claimed in claim 9, wherein the second electrode portions and the first electrode portions of the second capacitor electrode are integral with each other to define a seamless structure having a stripe pattern or a lattice pattern, a top surface of the first electrode portions extending above a top surface of the second electrode portions.

11. The organic light emitting diode display as claimed in claim 9, wherein the second electrode portions and the first electrode portions of the second capacitor electrode have coplanar bottom surfaces contacting the gate insulating layer and defining the bottom surface of the second capacitor electrode, and are arranged alternately to overlap an entire length of the first capacitor electrode.

12. The organic light emitting diode display as claimed in claim 9, wherein the gate electrode and the second capacitor electrode include a same metal, the metal including at least one of molybdenum (Mo), chromium (Cr), and tungsten (W).

13. The organic light emitting diode display as claimed in claim 12, wherein:
   the gate electrode has a thickness of about 170 nm or more, and
   the second electrode portions of the second capacitor electrode each have a thickness larger than 0 nm and smaller than 75% of the thickness of the gate electrode.

14. The organic light emitting diode display as claimed in claim 13, wherein the first electrode portions of the second capacitor electrode each have the same thickness as the gate electrode.

15. The organic light emitting diode display as claimed in claim 9, wherein the second electrode portions of the second capacitor electrode each have a thickness within a range of about 10 nm to about 140 nm.

16. The organic light emitting diode display as claimed in claim 9, wherein a width of each of the second electrode portions is equal to or larger than a width of each of the first electrode portions, the widths extending in parallel to the bottom surface of the second capacitor electrode.

* * * * *